United States Patent [19]

Yamanaka

[11] Patent Number: 5,365,540
[45] Date of Patent: Nov. 15, 1994

[54] VERTICAL-TO-SURFACE OPTICAL SEMICONDUCTOR DEVICE AND APPARATUS FOR COUPLING OPTICAL SIGNALS

[75] Inventor: Yutaka Yamanaka, Tokyo, Japan
[73] Assignee: NEC Corporation, Tokyo, Japan
[21] Appl. No.: 124,601
[22] Filed: Sep. 22, 1993
[30] Foreign Application Priority Data Sep. 25, 1992 [JP] Japan .................. 4-256665

[51] Int. Cl.$^5$ ............................. H01S 3/19
[52] U.S. Cl. ........................ 372/92; 372/20; 372/45
[58] Field of Search ............. 372/45, 46, 50, 92, 372/34, 20, 43

[56] References Cited

U.S. PATENT DOCUMENTS

| 5,023,944 | 6/1991 | Bradley | 455/611 |
|---|---|---|---|
| 5,029,176 | 7/1991 | Chang-Hasnian | 372/50 |
| 5,068,869 | 11/1991 | Wang et al. | 372/50 |
| 5,086,430 | 2/1992 | Kapon et al. | 372/50 |

FOREIGN PATENT DOCUMENTS 1-196884  8/1989  Japan .
3-225886 10/1991  Japan .
3-283479 12/1991  Japan .

OTHER PUBLICATIONS

C. Chang-Hasnain et al., "Dyamic, Polarization and Transverse Mode Characteristics of Vertical Cavity Surface Emitting Lasers", Jun. 1991, vol. 27, No. 6, IEEE Journal of Quantum Electronics, pp. 1402–1409.

M. Shimizu et al., "A Method of Polarization Stabilization in Surface Emitting Lasers", Jun. 1991, vol. 30, No. 6A, Japanese Journal of Applied Physics, pp. 1015–1017.

T. Mukaihara et al., "Stress Effect for Polarisation Control of Surface Emitting Lasers", Mar. 12, 1992, vol. 288, No. 6, Electronic Letters, p. 555.

Ichiro Ogura et al, "Cascadable optical switching characteristics in vertical-to-surface transmission electrophotonic devices operated as vertical cavity lasers" Feb. 17, 1992, pp. 799–801, 1992 American Institute of Physics.

Primary Examiner—James W. Davie
Attorney, Agent, or Firm—Young & Thompson

[57] ABSTRACT

A vertical cavity of a rectangular shape having short and long sides is defined between first and second mirror layers. Thus, two resonant wavelengths are obtained in a vertical-to-surface optical semiconductor device having the vertical cavity. The resonant wavelengths are shifted in a long wavelength direction due to the heat generated in operation of the optical semiconductor device. A light of the shifted short wavelength emitted from the first optical semiconductor device is rotated in polarization plane by 90°, and is then received as a light of the non shifted long wavelength by the second optical semiconductor device.

5 Claims, 3 Drawing Sheets (a=b)

(b>a)

(b>a)

VERTICAL-TO-SURFACE OPTICAL SEMICONDUCTOR DEVICE AND APPARATUS FOR COUPLING OPTICAL SIGNALS

FIELD OF THE INVENTION

This invention relates to a vertical-to-surface optical semiconductor device and an apparatus for coupling optical signals, and more particularly to, a vertical-to-surface transmission electrophotonic device operating as a vertical cavity laser and an apparatus for transmission of information by using the vertical cavity lasers.

BACKGROUND OF THE INVENTION

A conventional vertical-to-surface optical semiconductor device is described on pages 799 to 801 of "Appl. Phys. Lett. 60(7), Feb. 17, 1992", in which the conventional vertical-to-surface optical semiconductor device operates as a vertical cavity laser.

The conventional vertical-to-surface optical semiconductor device comprises, especially, a first mirror layer, an active layer, and a second mirror layer successively grown on a substrate, wherein the layers are mesa-etched to be square at the horizontal cross-section and to confine light in the transverse direction, such that a cavity is formed between the first and second mirror layers.

The vertical-to-surface optical semiconductor device also operates as a photodetector. For this function, first and second vertical-to-surface optical semiconductor devices may be optically coupled, such that the second vertical-to-surface optical semiconductor device receives an optical signal emitted from the first one. Thus, an apparatus for coupling optical signals is structured to exchange optical information between the first and second vertical-to-surface optical semiconductor devices.

In the conventional vertical-to-surface optical semiconductor device, however, there is a disadvantage in that a lasing wavelength shifts in a direction of longer wavelengths due to the heat generated therein during lasing operation. Consequently, the detection precision is lowered in the optical signal coupling apparatus comprising the first and second vertical-to-surface optical semiconductor devices, because the light receiving device has no shift in the oscillation wavelength, while the light emitting device has the shift of the lasing wavelength, as described above.

SUMMARY OF THE INVENTION

Accordingly, it is an object of the invention to provide a vertical-to-surface optical semiconductor device having first and second lasing wavelengths, an interval of which is equal to a wavelength shift occurring due to the heat generated therein during lasing operation.

It is a second object of the invention to provide an apparatus for coupling optical signals in which a high precision of detecting a receiving light is maintained to provide a high coupling efficiency.

According to the first feature of the invention, a vertical-to-surface optical semiconductor device, comprises:

a first mirror layer, a first cladding layer, an active layer, a second cladding layer, and a second mirror layer, successively, grown on a semiconductor substrate to provide a vertical cavity between the first and second mirror layers;

wherein the vertical cavity is of a rectangular shape having short and long sides to provide first and second resonant wavelengths having a wavelength difference therebetween equal to a wavelength shift induced by a heat generated in operation of the vertical cavity, the first wavelength being shorter than the second wavelength, and light polarization planes of the first and second wavelengths being orthogonal to each other.

According to the second feature of the invention, an apparatus for coupling optical signals, comprises:

first and second vertical-to-surface optical semiconductor devices, each of the first and second vertical-to-surface optical semiconductor devices comprising a first mirror layer, a first cladding layer, an active layer, a second cladding layer, and a second mirror layer, successively, grown on a semiconductor substrate to provide a vertical cavity between the first and second mirror layers, wherein the vertical cavity is of a rectangular shape having short and long sides to provide first and second resonant wavelengths having a wavelength difference therebetween equal to a wavelength shift induced by a heat generated in operation of the vertical cavity, the first wavelength being shorter than the second wavelength, and light polarization planes of the first and second wavelengths being orthogonal to each other; and means for coupling optical signals between the first and second vertical-to-surface optical semiconductor devices;

wherein the first vertical-to-surface optical semiconductor device emits a light for the optical signals of the second wavelength being shifted from the first wavelength, and the second vertical-to-surface optical semiconductor device receives the light emitted from the first vertical-to-surface optical semiconductor device via the coupling means.

BRIEF DESCRIPTION OF THE DRAWINGS

The invention will be explained in more detail in conjunction with appended drawings, wherein.

DETAILED DESCRIPTION OF THE PREFERRED EMBODIMENTS

Figure 1:
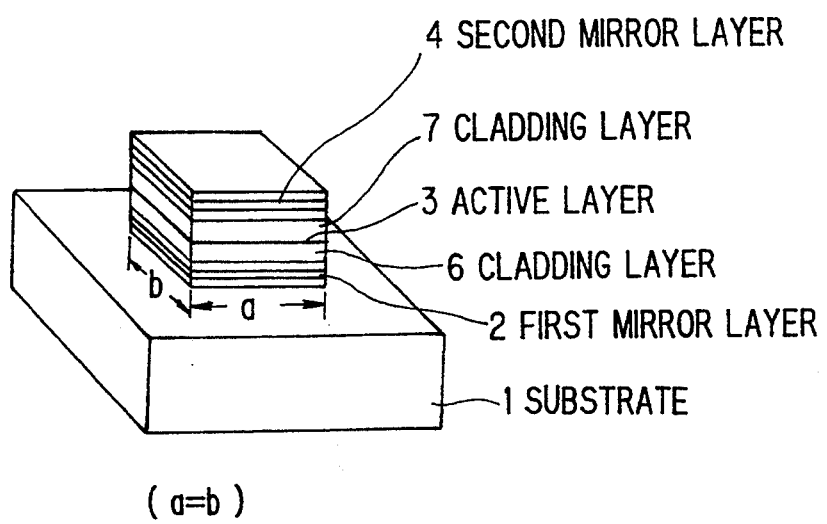
FIG. 1 is a schematic perspective view showing a conventional vertical-to-surface optical semiconductor device.

Before explaining a vertical-to-surface optical semiconductor device in the first preferred embodiment according to the invention, the conventional vertical-to-surface optical semiconductor device which is briefly described before will be explained in FIG. 1.

The conventional vertical-to-surface optical semiconductor device comprises a n-GaAs substrate 1, a first mirror layer 2 of n-AlAs/GaAs layers, an active layer 3 of InGaAs quantum well layers, and a second mirror layer 4 of p-AlAs/GaAs layers, wherein the active layer 3 is sandwiches by cladding layers 6 and 7 of n-AlGaAs and p-AlGaAs, and n- and p-electrodes (not shown) are provided to apply an electric field across the active layer.

As shown in FIG. 1, the first and second mirror layers 2 and 4, the active layer 3, and the cladding layers 6 and 7 are mesa-etched to be square (a=b) in the horizontal cross-section, so that a cavity is structured between the first and second mirror layers 2 and 4, and transverse-direction lights are confined therein.

First and second vertical-to-surface optical semiconductor devices each having the structure as explained above are optically coupled, such that the first one operates as a light transmitter and the second one operates as a light receiver. Thus, an optical signal coupling apparatus is systemized to exchange optical information therebetween.

However, there is a disadvantage in that a coupling efficiency is lowered, because a lasing wavelength of the first vertical-to-surface optical semiconductor device operating as the light transmitter shifts in the longer wavelength direction due to the heat generated therein, while a resonant wavelength of the second vertical-to-surface optical semiconductor device operating as the light receiver does not shift due to no heat generated therein.

Figure 2:
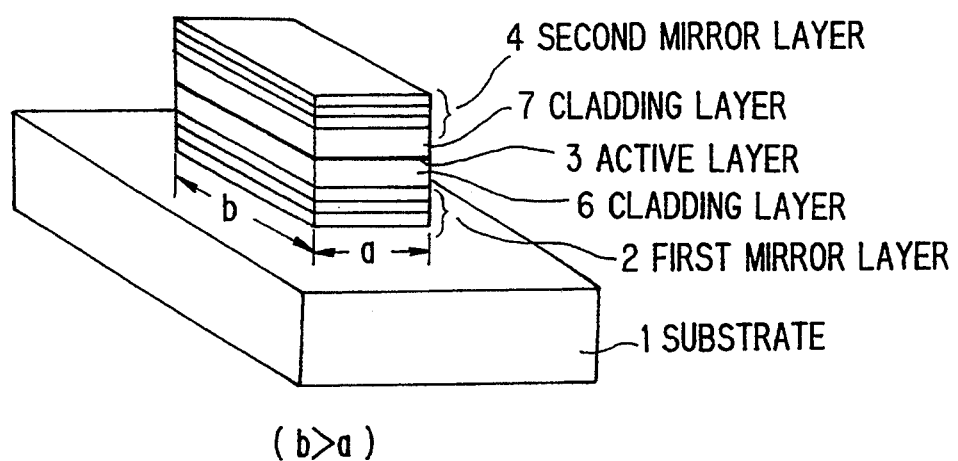
FIG. 2 is a schematic perspective view showing a vertical-to-surface optical semiconductor device in a first preferred embodiment according to the first invention.

FIG. 2 shows a vertical-to-surface optical semiconductor device in the first preferred embodiment according to the first invention, wherein like parts are indicated by like reference numerals as used in FIG. 1.

In the first preferred embodiment, the vertical-to-surface optical semiconductor device is structured to have a short side a of 3 µm ad a long side b of 6 µm, and the active layer 3 consists of three quantum well layers of $In_{0.2}Ga_{0.8}As$ each having a thickness of 10 nm, so that a first lasing wavelength of 950.0 nm for S polarization light and a second lasing wavelength of 950.4 nm of P polarization light are obtained, and a gain for the S polarization light is higher than that for the P polarization light, wherein the wavelength difference of 0.4 nm between the S and P polarization lights orthogonal to each other is set to be a wavelength shift occurring due to the heat generated in the vertical-to-surface optical semiconductor device.

Figure 3A:
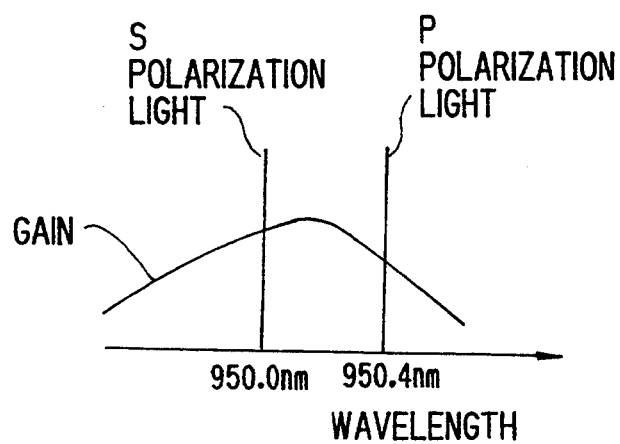
FIGS. 3A and 3B are explanatory diagrams showing two different lasing wavelengths and the shift thereof in the first preferred embodiment.
Figure 3B:
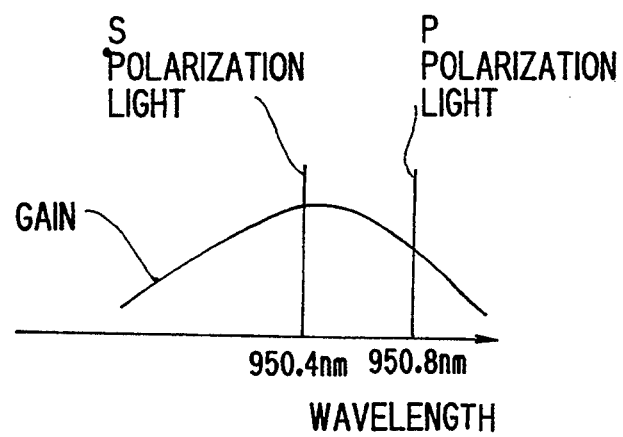

FIG. 3A shows the S and P polarization lights having the lasing wavelengths of 950.0 nm and 950.4 nm, and the wavelength difference of 0.4 nm, and FIG. 3B shows wavelength shifts from 950.0 nm to 950.4 nm for the S polarization light and from 950.4 nm to 950.8 nm for the P polarization light, wherein each shift amount is equal to the wavelength difference between the S and P polarization lights.

In practical operation, lasing is induced in a mode on the side of a large gain. For this purpose, the active layer 3 is designed to provide a peak of the gain as shown in FIG. 3B.

Figure 4:
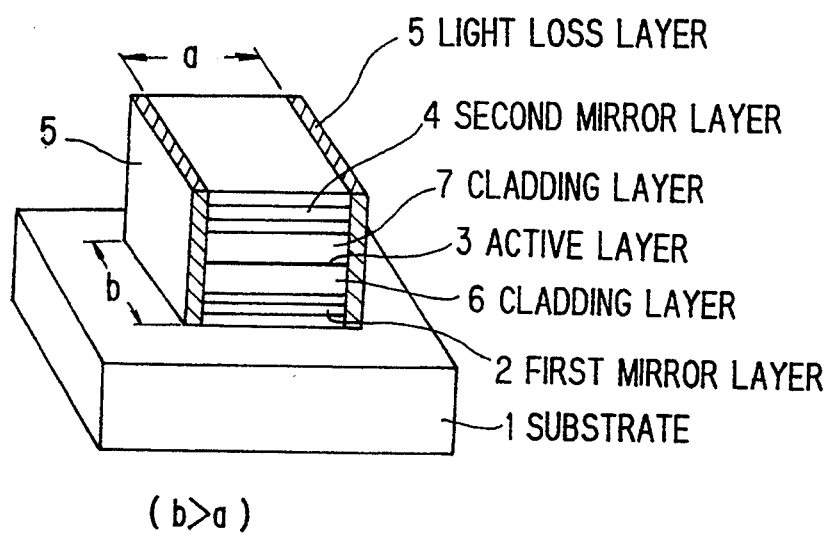
FIG. 4 is a schematic perspective view showing a vertical-to-surface optical semiconductor device in a second preferred embodiment according to the first invention.

FIG. 4 shows a vertical-to-surface optical semiconductor device in the second preferred embodiment according to the first invention, wherein like parts are indicated by like reference numerals as used in FIGS. 1 and 2.

In the second preferred embodiment, the vertical-to-surface optical semiconductor device comprises optical loss layers 5 of a metal or a semiconductor doped with a metal on both planes of the long sides b.

In the second preferred embodiment, a vertical cavity structure is designed to provide an electric field orthogonal to the optical loss layers 5 for the S polarization light, and an electric field parallel to the optical loss layers 5 for the P polarization light, so that loss for the P polarization light is increased to suppress lasing operation for the P polarization light.

In the first and second preferred embodiments, although the rectangular shape having short and long sides a and b is adopted to provide two lasing wavelength, other shape such as oval, etc. may be adopted. Further, a ratio of In may be reduced in the active layer 3, and/or the quantum layer may be thinner than 10 nm in the active layer 3, so that a gain is increased on the side of a short wavelength. Still further, the active layer 3 may be a bulk layer of AlGaAs, and a lasing wavelength may be controlled by a mixed ratio between Al and Ga. The pn structure in the vertical-to-surface optical semiconductor device may be replaced by a pnpn thyrister structure.

Figure 5:
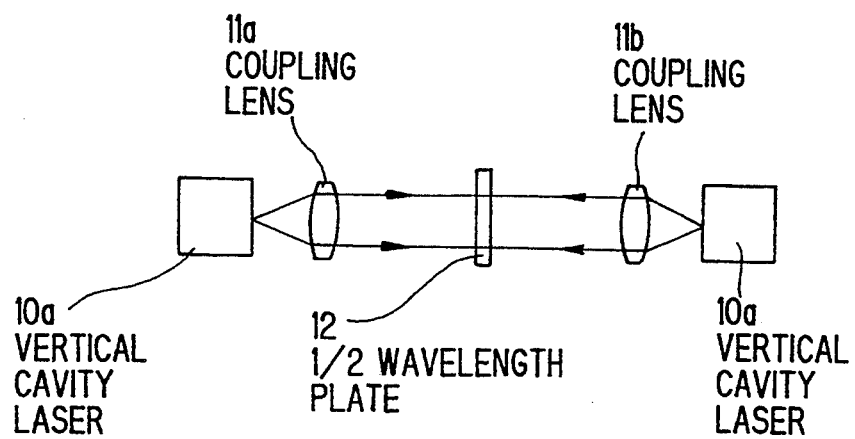
FIG. 5 is an explanatory diagram showing an apparatus for coupling optical signals in a preferred embodiment according to the second invention.

FIG. 5 shows an apparatus for coupling optical signals in the preferred embodiment according to the second invention. The optical signal coupling apparatus comprises first and second vertical-to-surface optical semiconductor devices (vertical cavity lasers) 10a and 10b, as shown in FIG. 2, having the lasing wavelengths as shown in FIGS. 3A and 3B, coupling lenses 11a and 11b for collimating an emitting light and for focusing a collimated light, and a ½ wavelength plate 12 for rotating a polarization plane of a light transmitted therethrough by 90°.

In operation, the optical semiconductor device 10a is driven to emit the S and P polarization lights as shown in FIG. 3A, and after several micro seconds of starting the operation, the optical semiconductor device 10a is increased in temperature by the heat generated therein, so that the S and P polarization lights shift in wavelength, as shown in FIG. 3B. Thus, the S polarization light having a wavelength of 950.4 nm emitted from the optical semiconductor device 10a is collimated by the coupling lens 11a, and the collimated S polarization light is rotated in polarization planed to be the P polarization light having the wavelength of 950.4 nm by 90°, when it is transmitted through the ½ wavelength plate 12. The P polarization light thus transmitted through the ½ wavelength plate 12 is focused on the optical semiconductor device 10b, so that the P polarization light having the wavelength of 950.4 nm is detected in the optical semiconductor device 10b which is not increased in temperature to have resonant wavelengths as shown in FIG. 3A.

Even if case where the optical semiconductor device 10b emits the S polarization light having the wavelength of 950.4 nm, and the optical semiconductor device 10a receives the P polarization light of the same wavelength, the same operation as described above is carried out except for the difference in which light propagation direction is reverse.

In the optical signal coupling apparatus, the ½ wavelength plate 12 may be omitted, when the optical semiconductor device 10a or 10b is positioned in the form of rotation by 90°. Further, the optical semiconductor devices 10a and 10b may be replaced by array type semiconductor devices each having an array of optical semiconductor devices.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is

1. A vertical-to-surface optical semiconductor device, comprising:

a first mirror layer, a first cladding layer, an active layer, a second cladding layer, and a second mirror layer, successively, grown on a semiconductor substrate to provide a vertical cavity between said first and second mirror layers;

wherein said vertical cavity is of a rectangular shape having short and long sides to provide first and second resonant wavelengths having a wavelength difference therebetween equal to a wavelength shift induced by a heat generated in operation of said vertical cavity, said first wavelength being shorter than said second wavelength, and light polarization planes of said first and second wavelengths being orthogonal to each other.

2. A vertical-to-surface optical semiconductor device, according to claim 1, wherein:

said active layer is of quantum well layers of InGaAs; and a composition ratio of In in said quantum well layers and a thickness of said quantum well layers are adjusted;

whereby a gain for a light of said first wavelength is higher than that for a light of said second wavelength.

3. An apparatus for coupling optical signals, comprising:

first and second vertical-to-surface optical semiconductor devices, each of said first and second vertical-to-surface optical semiconductor devices comprising a first mirror layer, a first cladding layer, an active layer, a second cladding layer, and a second mirror layer, successively, grown on a semiconductor substrate to provide a vertical cavity between said first and second mirror layers, wherein said vertical cavity is of a rectangular shape having short and long sides to provide first and second resonant wavelengths having a wavelength difference therebetween equal to a wavelength shift induced by a heat generated in operation of said vertical cavity, said first wavelength being shorter than said second wavelength, and light polarization planes of said first and second wavelengths being orthogonal to each other; and means for coupling optical signals between said first and second vertical-to-surface optical semiconductor devices;

wherein said first vertical-to-surface optical semiconductor device emits a light for said optical signals of said second wavelength being shifted from said first wavelength, and said second vertical-to-surface optical semiconductor device receives said light emitted from said first vertical-to-surface optical semiconductor device via said coupling means.

4. An apparatus for coupling optical signals, according to claim 3, wherein:

said coupling means comprises a ½ wavelength plate for rotating a polarization plane of said light emitted from said first vertical-to-surface optical semiconductor device by 90°.

5. An apparatus for coupling optical signals, according to claim 3, wherein:

said first vertical-to-surface optical semiconductor device is positioned to be rotated relation to said second vertical-to-surface optical semiconductor device by 90°.

* * * * *